(12) United States Patent
Pancholi et al.

(10) Patent No.: US 12,362,325 B2
(45) Date of Patent: *Jul. 15, 2025

(54) MONOLITHIC CHIP STACKING USING A DIE WITH DOUBLE-SIDED INTERCONNECT LAYERS

(71) Applicant: Intel Corporation, Santa Clara, CA (US)

(72) Inventors: Anup Pancholi, Hillsboro, OR (US); Kimin Jun, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 26 days.

This patent is subject to a terminal disclaimer.

(21) Appl. No.: 18/239,549

(22) Filed: Aug. 29, 2023

(65) Prior Publication Data

US 2023/0411356 A1 Dec. 21, 2023

Related U.S. Application Data

(63) Continuation of application No. 17/538,200, filed on Nov. 30, 2021, now Pat. No. 11,784,165, which is a
(Continued)

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/565* (2013.01); *H01L 21/6835* (2013.01);
(Continued)

(58) Field of Classification Search
CPC ............... H01L 25/0657; H01L 21/565; H01L 21/6385; H01L 24/73; H01L 24/92
(Continued)

(56) References Cited

U.S. PATENT DOCUMENTS 5,399,898 A 3/1995 Rostoker
9,583,460 B2 2/2017 Ray
(Continued)

FOREIGN PATENT DOCUMENTS

CN 106133897 11/2016
DE 102014108992 12/2014
(Continued)

OTHER PUBLICATIONS

International Preliminary Report on Patentability for PCT Application No. PCT/US17/53291, mailed Apr. 9, 2020.
(Continued)

*Primary Examiner* — Jasmine J Clark
(74) *Attorney, Agent, or Firm* — Schwabe, Williamson & Wyatt P.C.

(57) ABSTRACT

An apparatus is provided which comprises: a first die having a first surface and a second surface, the first die comprising: a first layer formed on the first surface of the first die, and a second layer formed on the second surface of the first die; a second die coupled to the first layer; and a plurality of structures to couple the apparatus to an external component, wherein the plurality of structures is coupled to the second layer.

14 Claims, 7 Drawing Sheets

Related U.S. Application Data continuation of application No. 16/633,543, filed as application No. PCT/US2017/053291 on Sep. 25, 2017, now Pat. No. 11,251,158.

(51) Int. Cl.
  *H01L 21/683* (2006.01)
  *H01L 23/00* (2006.01)
  *H01L 25/00* (2006.01)

(52) U.S. Cl.
  CPC .............. *H01L 24/73* (2013.01); *H01L 24/92* (2013.01); *H01L 25/50* (2013.01); *H01L 2221/68372* (2013.01); *H01L 2224/73209* (2013.01); *H01L 2224/92133* (2013.01); *H01L 2225/06513* (2013.01); *H01L 2225/06524* (2013.01); *H01L 2225/06586* (2013.01)

(58) Field of Classification Search
  USPC ....................................................... 257/777
  See application file for complete search history.

(56) References Cited

U.S. PATENT DOCUMENTS

| | | | |
|---|---|---|---|
| 10,192,810 B2 | 1/2019 | Karhade | |
| 11,251,158 B2 | 2/2022 | Pancholi et al. | |
| 11,990,449 B2 | 5/2024 | Kim | |
| 2002/0030245 A1* | 3/2002 | Hanaoka | H01L 24/13 257/E21.597 |
| 2006/0220211 A1 | 10/2006 | Yamazaki et al. | |
| 2007/0267723 A1 | 11/2007 | Bernstein et al. | |
| 2008/0296763 A1 | 12/2008 | Chen | |
| 2011/0204505 A1 | 8/2011 | Pagaila | |
| 2015/0340327 A1 | 11/2015 | Uzoh | |
| 2015/0371938 A1 | 12/2015 | Katkar et al. | |
| 2017/0170155 A1 | 6/2017 | Yu et al. | |
| 2018/0358328 A1 | 12/2018 | Kang et al. | |

FOREIGN PATENT DOCUMENTS

| | | |
|---|---|---|
| WO | WO-2013016264 | 1/2013 |
| WO | 2017111792 | 6/2017 |

OTHER PUBLICATIONS

International Search Report and Written Opinion for International Patent Application No. PCT/US17/53291, mailed on Jun. 22, 2018.
Non-Final Office Action for U.S. Appl. No. 16/633,543, dated Apr. 14, 2021.
Notice of Allowance from U.S. Appl. No. 17/538,200 notified Jun. 1, 2023, 7 pgs.
Office Action for U.S. Appl. No. 17/538,200, dated Nov. 25, 2022.
Notice of Allowance from U.S. Appl. No. 16/633,543 notified Oct. 18, 2021, 5 pgs.
Office Action for China Patent Application No. 201780094256.5 mailed Jun. 28, 2024, 9 pgs.
Office Action for China Patent Application No. 201780094256.5 mailed Dec. 25, 2023, 26 pgs.
Notice of Allowance for China Patent Application No. 201780094256.5 mailed Nov. 14, 2024, 7 pgs.
Office Action for U.S. Appl. No. 18/374,972, dated Dec. 31, 2024, 9 pgs.

\* cited by examiner

MONOLITHIC CHIP STACKING USING A DIE WITH DOUBLE-SIDED INTERCONNECT LAYERS

CLAIM OF PRIORITY

This Application is a continuation of U.S. patent application Ser. No. 17/538,200, filed Nov. 30, 2021 and titled "MONOLITHIC CHIP STACKING USING A DIE WITH DOUBLE-SIDED INTERCONNECT LAYERS", which is a continuation of U.S. patent application Ser. No. 16/633,543, filed Jan. 23, 2020 and titled "MONOLITHIC CHIP STACKING USING A DIE WITH DOUBLE-SIDED INTERCONNECT LAYERS", which is a National Stage Entry of, and claims priority to, PCT Application No. PCT/US2017/053291, filed on Sep. 25, 2017 and titled "MONOLITHIC CHIP STACKING USING A DIE WITH DOUBLE-SIDED INTERCONNECT LAYERS", which are incorporated by reference in their entireties for all purposes.

BACKGROUND

Generally, when two or more semiconductor dies are to be stacked, die to die interconnection may be achieved using an additional interconnecting die, such as an interposer, a bridge die, using Through Silicon Via (TSV) structures, etc. However, adding such additional die to die interconnection elements may lead to an increase in cost and complexity, and may also increase a die to die interconnect length.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
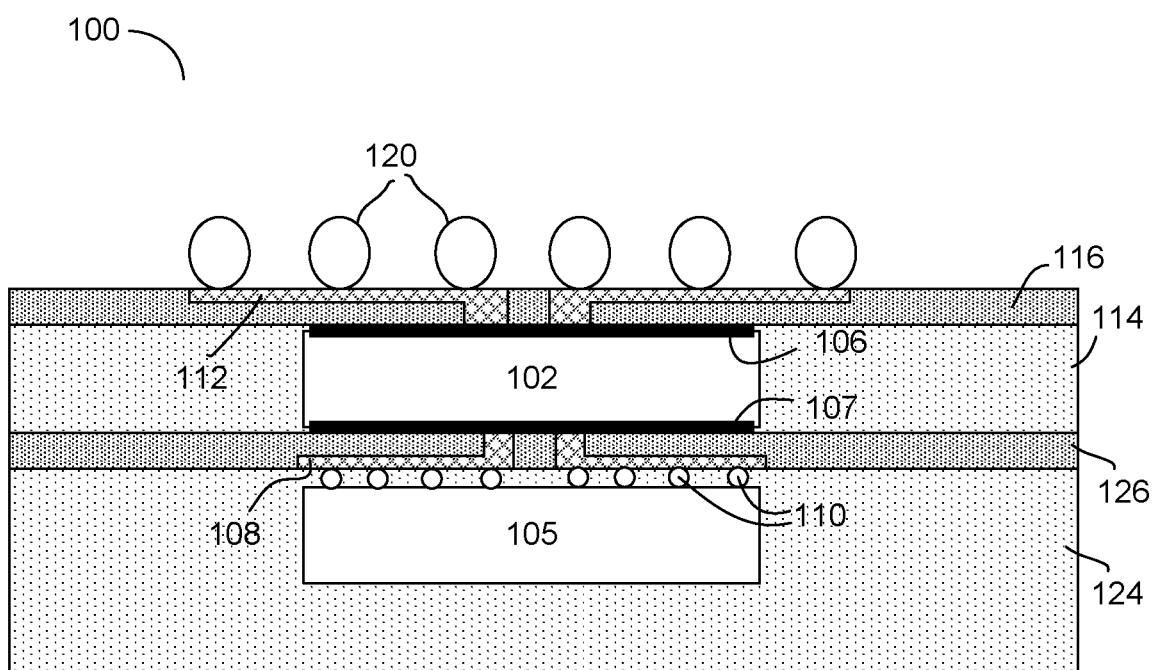
FIG. 1 schematically illustrates a semiconductor package comprising a first die having interconnect layers formed on two opposing sides, and a second die coupled to the first die, according to some embodiments.

In some embodiments, a semiconductor package may comprise a plurality of stacked dies. The stacked dies may comprise a first die having interconnect layers formed on two opposing surfaces of the first die. For example, a first interconnect layer on a first surface of the first die may be coupled to a second die; and a second interconnect layer on a second surface of the first die may be coupled to package interconnect structures (e.g., for coupling the apparatus to an external component).

In some embodiments, the first die with the interconnect layers formed on the two opposing surfaces may not have any TSVs for connecting the interconnect layers. For example, both the interconnect layers may be connected to active components of the first die. Accordingly, a thickness of the first die may be relatively less, and this may result in relatively thin die to die interconnection. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right." "front" "back," "top," "bottom," "over." "under." and the like in the description and in the claims, if any, are used for descriptive purposes and not necessarily for describing permanent relative positions.

FIG. 1 schematically illustrates a semiconductor package 100 (henceforth also referred to as "package 100") comprising a first die 102 having interconnect layers formed on two opposing sides, and a second die 105 coupled to the first die, according to some embodiments. In some embodiments, the dies 102, 105 may be any appropriate type of dies to implement any appropriate type of functionalities, e.g., a memory die, a processor die, a graphics die, and/or the like.

In some embodiments, the die 102 may comprise interconnect layers 106 and 107 formed on two opposing sides or surfaces of the die 102, where the interconnect layers 106 and 107 are symbolically illustrated using thick lines. For example, each of the interconnect layers 106 and 107 may be coupled to various corresponding internal components (e.g., active components, transistors, etc.) of the die 102.

In some embodiments, the interconnect layers 106 and 107 may comprise traces, redistribution layers (RDLs), routing structures, routing layers, interconnect structures (e.g., bumps, bump pads, metal pillars, balls formed using metals, alloys, solderable material, solder formed using metals, alloys, solderable material, and/or the like), and/or other interconnect components on respective surfaces of the die 102. In some embodiments, the die 102 may be encapsulated using an encapsulant or molding compound 114.

In some embodiments, RDL layer 108 may be attached or coupled to the interconnect layer 107, where the RDL layer 108 may be embedded within encapsulant or molding compound 126. In some embodiments, the RDL layer 108 may redistribute the connections of the interconnect layer 107.

The die 105 may be attached to, or coupled to, the RDL layer 108 via interconnect structures 110. The interconnect structures 110 may comprise, for example, bumps, bump pads, metal pillars (e.g., copper pillars), balls formed using metals, alloys, solderable material, solder formed using metals, alloys, solderable material, and/or the like. In some embodiments, the die 105 may be encapsulated using an encapsulant or molding compound 124.

In some embodiments, RDL layer 112 may be attached to the interconnect layer 106, where the RDL layer 112 may be embedded within encapsulant or molding compound 116. In some embodiments, the RDL layer 112 may redistribute the connections of the interconnect layer 106. In some embodiments, the RDL layer 112 may be attached to, or coupled to, package interconnect structures 120. The interconnect structures 120 may comprise, for example, bumps, bump pads, metal pillars (e.g., copper pillars), balls formed using metals, alloys, solderable material, solder formed using metals, alloys, solderable material, and/or the like. In some embodiments, the package 100 may be attached to an external component (e.g., a substrate, a motherboard, etc., not illustrated in FIG. 1) using the interconnect structures 120.

Thus, in the package 100, the die 102 may be coupled to the die 105 using the interconnect layer 107 formed on a first side of the die 102. Furthermore, the die 102 may be coupled to the package interconnect structures 120 (e.g., for attachment to an external component) using the interconnect layer 106 formed on a second side of the die 102. Thus, the die 102 may be stacked on the die 105, without any intervening die structure, such as an interposer, a bridge die, etc. In some embodiments, the interconnect layers 106 and 107 may not be connected to each other through vias or TSVs. This may result in a reduction in a die to die interconnect length between the dies 102 and 105.

Figure 2A:
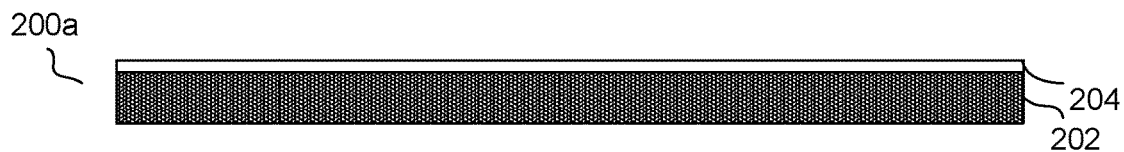
FIGS. 2A-2K illustrate a process of forming a semiconductor package, where the semiconductor package comprises a first die having interconnect layers formed on two opposing sides, and a second die coupled to the first die, according to some embodiments.
Figure 2B:
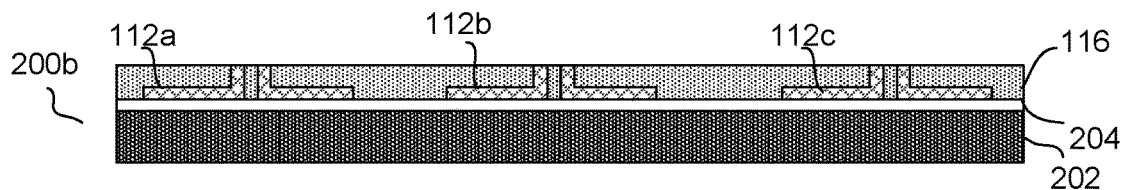

FIGS. 2A-2K illustrate a process of forming a semiconductor package (e.g., the package 100 of FIG. 1), where the semiconductor package comprises a first die having interconnect layers formed on two opposing sides, and a second die coupled to the first die, according to some embodiments. Referring to FIG. 2A, illustrated is a component 200a comprising a temporary substrate or wafer, e.g., a carrier 202, and an adhesive layer 204 attached to the carrier 202. Referring to FIG. 2B, illustrated is a component 200b formed from the component 200a, where the component 200b may comprise RDL layers 112a, 112b, 112c formed on the temporary carrier 202. In some embodiments, the RDL layers 112a, 112b, 112c may be embedded within encapsulant or molding compound 116. The RDL layers 112a, 112b, 112c may correspond to the RDL layer 112 of FIG. 1.

It is to be noted that FIGS. 2A-2K illustrate formation of three example packages, each of which may be similar to the package 100 of FIG. 1. In some examples, more than three packages may be formed. For ease of discussion, formation of one or some of the three packages of FIGS. 2A-2L are discussed in detail herein. For example, referring to FIG. 2B, the three packages may be respectively formed over the RDL layers 112a, 112b and 112c—however, the package formed on one of the RDL layers 112 (e.g., RDL layer 112b) may be discussed in detail for ease of discussion (and the same discussion may be applied to the other two packages formed on the two sides).

Elements referred to herein with a common reference label followed by a particular number or alphabet may be collectively referred to by the reference label alone. For example, RDLs 112a, 112b, and 112c may be collectively and generally referred to as RDLs 112 in plural, and RDL 112 in singular. Similarly dies 104a, 104b, and 104c (e.g., discussed herein later) may be collectively and generally referred to as dies 104 in plural, and die 104 in singular.

Figure 2C:
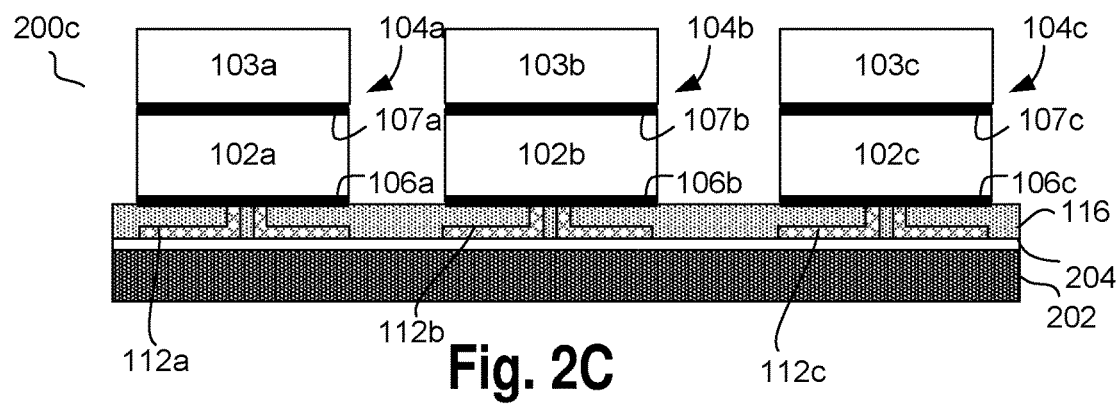

Now referring to FIG. 2C, dies 104a, 104b, and 104c are placed over the carrier 202, e.g., respectively over the RDL layers 112a, 112b, and 112c, to form a component 200c. As an example, the die 104b may comprise a section 102b, which may comprise active components such as transistors. Interconnect layers 106b and 107b may be formed on two opposing sides of the section 102b. For example, the interconnect layer 106b may be attached or coupled to the RDL layer 112b. The die 104b may further comprise section 103b, which may be formed on the interconnect layer 107b. In some embodiments, the section 103b may not include active circuit components. For example, the section 103b may not comprise any transistors. In an example, the section 103b may be referred to as "bulk layer," "bulk section", "inactive layer," "supporting layer," "sacrificial layer," or the like. In some embodiments, the section 103b may comprise bulk silicon, while in some other embodiments, the section 103b may comprise silicon and/or heterogeneous integration such as III-V, III-N, sapphire, glass, and/or the like.

In some embodiments, the section 103b may provide mechanical strength and stability to the section 102b and the interconnect layer 107b. In an example, the section of the die 104b between the interconnect layers 106b and 107b may be referred to as a transistor layer (e.g., as this section comprises the active components). The interconnect layer 107b may be between the transistor layer and the bulk layer 103b.

Figure 2D:
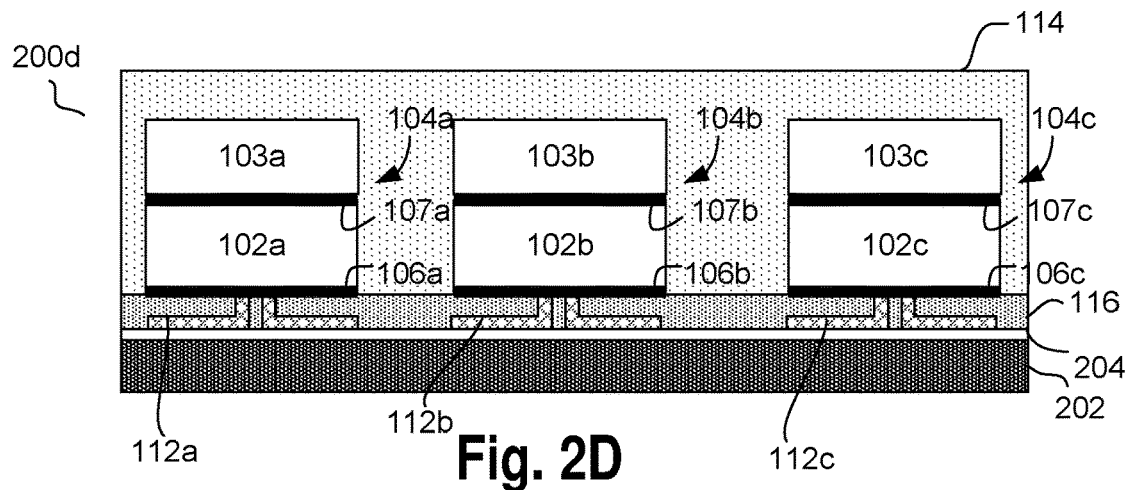
Figure 2E:
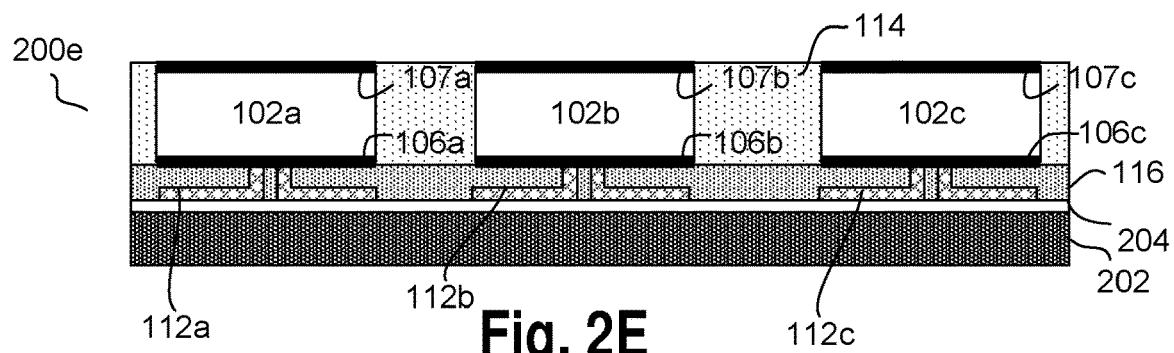

Now referring to FIG. 2D, dies 104a, 104b, and 104c are encapsulated by encapsulant or molding compound 114, to form a component 200d. Now referring to FIG. 2E, the molding compound 114 may be selectively or partially removed (e.g., using grinding, Chemical Mechanical Planarization or CMP, surface planar (e.g., by blade cut), etching, etc.) to form a component 200e. For example, a top part of the molding compound 114, along with the sections 103a, 103b, 103c of the dies 104a, 104b, 104c, respectively, may be removed in the component 200e. In some embodiments, due to the removal process performed with respect to FIG. 2E, the interconnect layers 107a, 107b, 107c may be exposed through the molding compound 114. In some embodiments, the removal in the component 200e may be performed using, for example, mechanical grinding, polishing process such as Chemical Mechanical Planarization (CMP), etching (e.g., dry etch, wet etch, etc.), surface planar (e.g., blade cut), and/or the like.

Figure 2F:
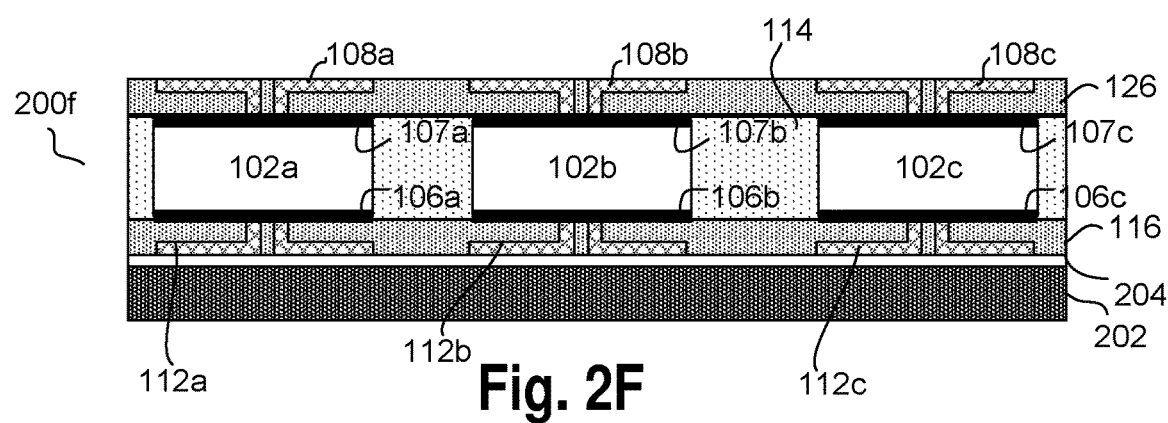

Referring now to FIG. 2F, in a component 200f, RDL layers 108a, 108b, and 108c may be formed on the interconnect layers 107a, 107b, 107c, respectively. In some embodiments, the RDL layers 108a, 108b, 108c may be embedded within encapsulant or molding compound 126. In an example, the RDL layers 108a, 108b, 108c may correspond to the RDL layer 108 of FIG. 1.

Figure 2G:
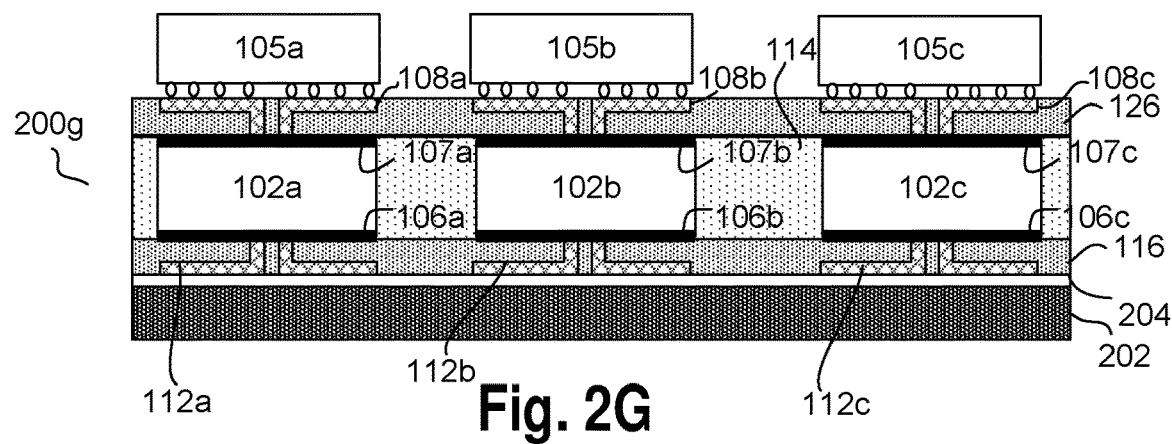

Referring now to FIG. 2G, in a component 200g, dies 105a, 105b, and 105c may be respectively placed on the RDL layers 108a, 108b, and 108c of the component 200f. In an example, the dies 105a, 105b, 105c may correspond to the die 105 of FIG. 1.

Figure 2H:
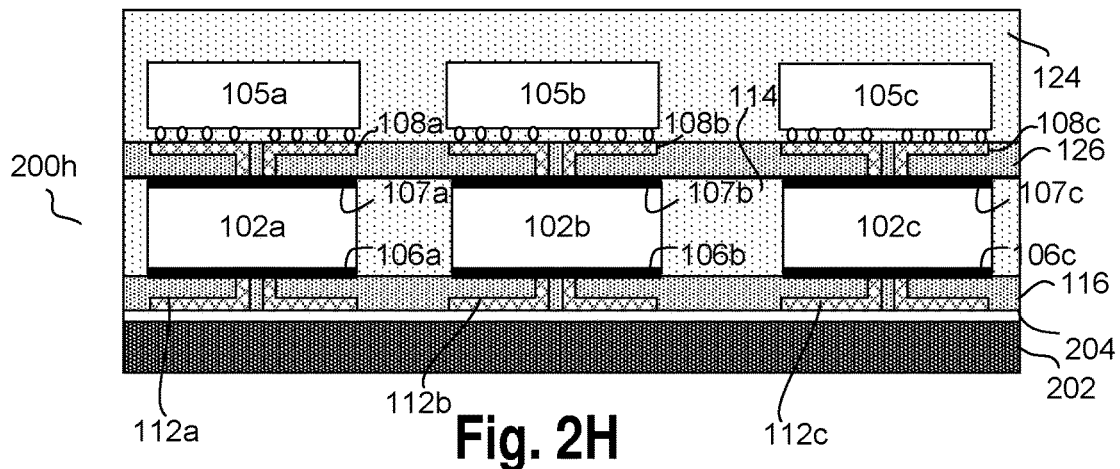

Referring now to FIG. 2H, in a component 200h, in some embodiments, the dies 105a, 105b, 105c may be encapsulated using an encapsulant or molding compound 124. For example, the molding compound 124 may overmold the dies 105a, 105b, 105c, such that these dies are completely encapsulated by the molding compound 124, and are not exposed through the molding compound 124.

Figure 2I:
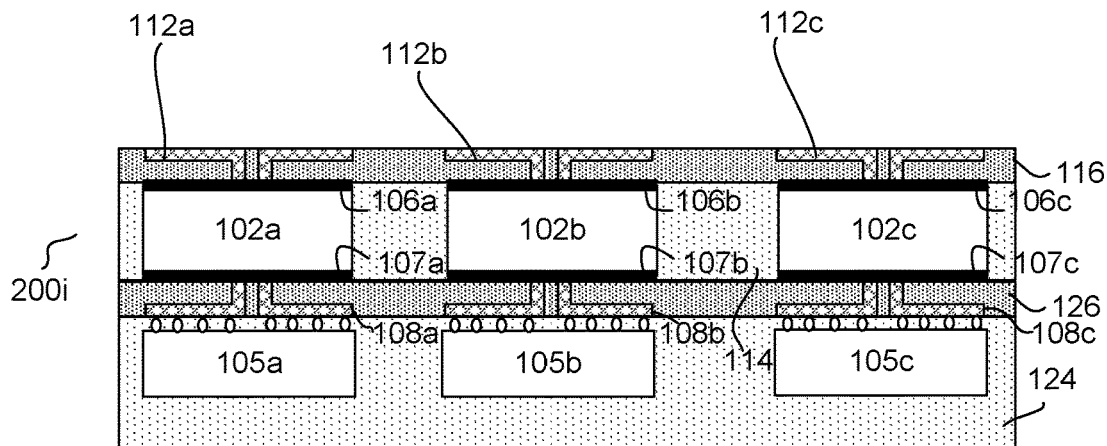

Referring now to FIG. 2I, in a component 200i, in some embodiments, the component 200h may be flipped and the wafer carrier 202 may be removed. Removal of the wafer carrier 202 may be dependent on an adhesive used in the temporary carrier, and one or more processes like Ultraviolet (UV) release mechanism, thermal release mechanism, mechanical release mechanism, infrared release mechanism, and/or the like may be used.

Figure 2J:
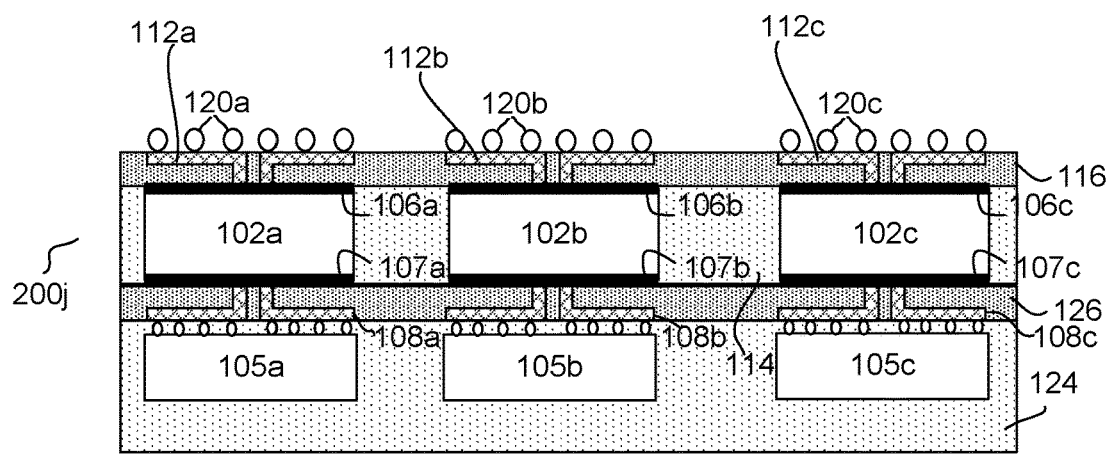

Referring now to FIG. 2J, in a component 200j, in some embodiments, interconnect structures 120a, 120b, and 120c may be respectively attached to the RDL layers 112a, 112b, and 112c. In an example, the interconnect structures 120a, 120b, 120c 120b may correspond to the interconnect structures 120 of the component 100 of FIG. 1.

Figure 2K:
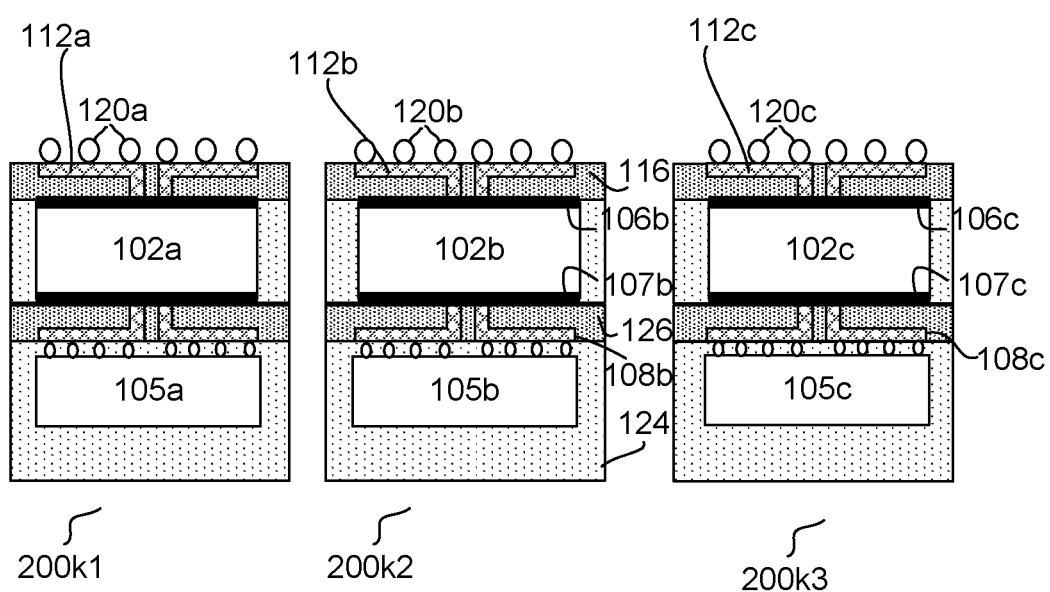

Referring now to FIG. 2K, the component 200j may be singulated to form three semiconductor packages 200k1, 200k2, and 200k3. In an example, where each of the packages 200k1, 200k2, and 20k3 may be similar to the package 100 of FIG. 1.

Thus, FIG. 1 illustrates the die 102 comprising interconnect layers 106 and 107 on both side of the transistor layer of the die 102, and FIGS. 2A-2K illustrate an example process to form such a die. In some embodiments, through the interconnects 106 and 107, the die 102 may be attached to RDLs, another die, package interconnect structures (e.g., interconnect structures 120), etc. from both sides.

In an example, there may not be vias, e.g., thick vias like TSVs, in the die 102. For example, there may not be any vias (e.g., TSVs) interconnecting the interconnect layers 106 and 107.

In some embodiments and as discussed with respect to FIGS. 2A-2K, there may not be any thin die handling, e.g., while forming the package 100. For example, the die 102 may be relatively thin. However, as discussed with respect to FIG. 2C, the die 102 may be assembled as a relatively thick die 104 (e.g., comprising the thinner die 102 and the supporting bulk layer 103). Assembling the thick die 104 (e.g., instead of assembling the thin die 103) and later removing the bulk layer 103 may, for example, enable elimination of support thickness in the final die 102. For example, the interconnect layer 107 may initially be buried within the die 104, and the interconnect layer 107 may be exposed after the bulk layer 103 is thinned out and removed in FIG. 2E. Such a process may enable formation of interconnect layers 106 and 107 on both sides of the die 102, without any need for any TSVs or higher thickness of the die 102 to support or connect these two layers.

Figure 3A:
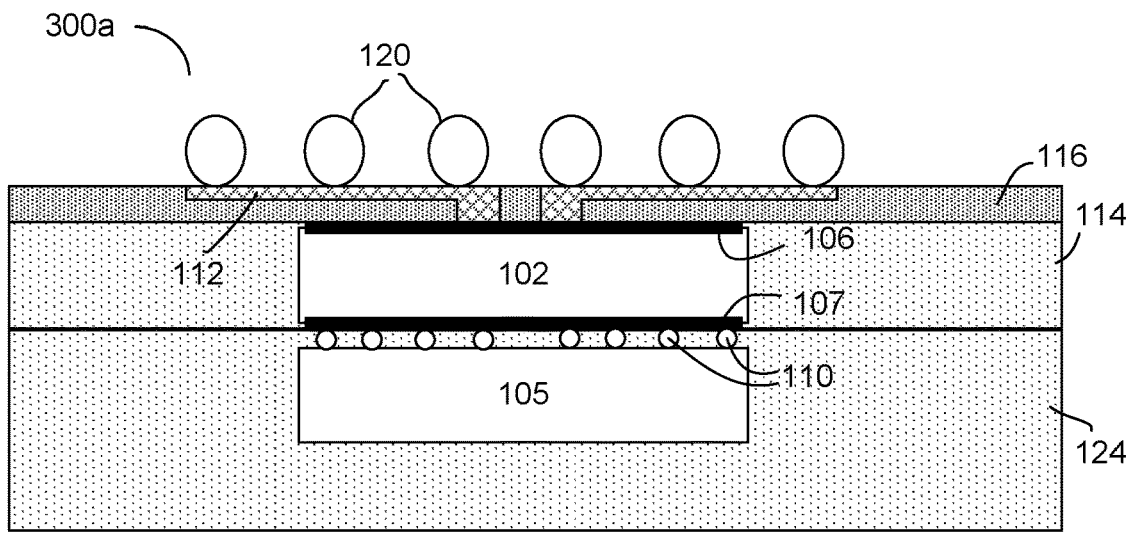
FIG. 3A schematically illustrates a semiconductor package comprising a first die having interconnect layers formed on two opposing sides and a second die coupled to the first die, without any intervening Redistribution Layer (RDL) between the first die and the second die, according to some embodiments.

Referring again to FIG. 1, this figure illustrates the example package 100. Variations of this package 100 may be possible. For example, the RDL layer 108 between the dies 102 and 105 may be removed, e.g., as illustrated in FIG. 3A. For example, FIG. 3A schematically illustrates a semiconductor package 300a (henceforth also referred to as "package 300a") comprising the first die 102 having interconnect layers formed on two opposing sides and the second die 105 coupled to the first die 102, without any intervening RDL layer between the first die 102 and the second die 105, according to some embodiments. The package 300a is at least in part similar to the package 100 of FIG. 1. However, unlike the package 100, in the package 300 there is no intervening RDL layer between the dies 102 and 105 (e.g., the RDL layer 108 of the package 100 is not formed in the package 300a). Formation and other details of the package 300a may be evident at least in part from those of the package 100, and hence, the package 300a is not discussed herein in further detail.

Figure 3B:
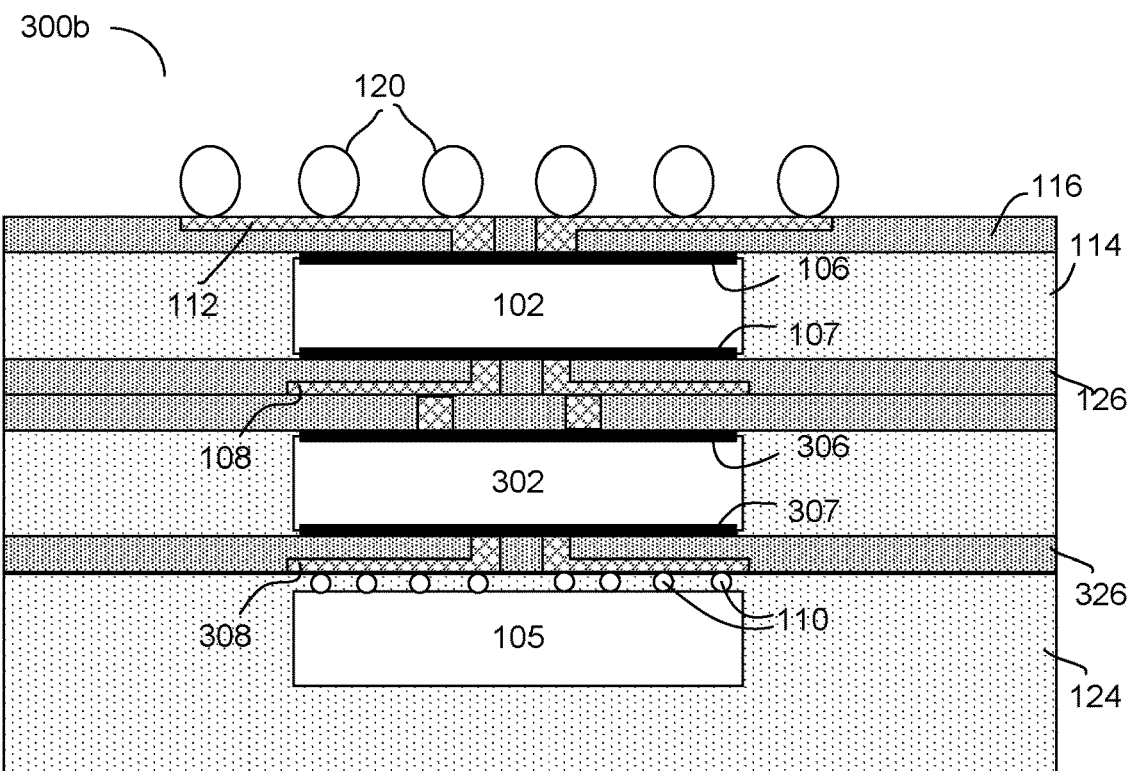
FIG. 3B schematically illustrates a semiconductor package comprising multiple stacked dies, with each of at least two dies having interconnect layers formed on two opposing sides, according to some embodiments.

In FIG. 1, a single die 102 with interconnect layers on both sides is illustrated. However, in some embodiments, multiple such dies may be stacked, e.g., as illustrated in FIG. 3B. For example, FIG. 3B schematically illustrates a semiconductor package 300b (henceforth also referred to as "package 300b") comprising multiple stacked dies, with each of at least two dies having interconnect layers formed on two opposing sides, according to some embodiments. The package 300b is at least in part similar to the package 100 of FIG. 1. However, unlike the package 100, in the package 300b, an additional die 302 may be present. The die 302 may be at least in part similar to the die 102 of FIG. 1. For example, the die 302 may have interconnect layers 306 and 307 formed on two opposing surfaces of the die 302. In some embodiments, the dies 102, 302 and 105 may be stacked, as illustrated in FIG. 3B. Although only two dies (e.g., dies 102 and 302) are illustrated in FIG. 3B having interconnect layers on both sides, more than two such dies may also be stacked. Formation and other details of the package 300b may be evident at least in part from those of the package 100, and hence, the package 300b is not discussed herein in further detail.

The packages 100, 300a, 300b may be used in many areas. As discussed, in these packages, a die (e.g., the die 102, 302) may have interconnect layers formed on two opposing sides, without any vias or TSVs interconnecting the two opposing sides. In some embodiments, this may result in relatively small thickness of the dies 102, 302, e.g., compared to thickness of conventional dies with TSVs, which may result in better performance (e.g., due to the reduction in die to die interconnect length and coupling capacitance). In addition, die assembly discussed with respect to FIGS. 2A-2K may allow integration of different technologies, die and/or original wafer sizes.

In some embodiments, the dies 102, 105 and/or 302 may be used for a variety of purposes, e.g., as microprocessors, memory dies, graphics dies, Microelectromechanical systems (MEMS) dies, analog and RF integration dies, etc.

Figure 4:
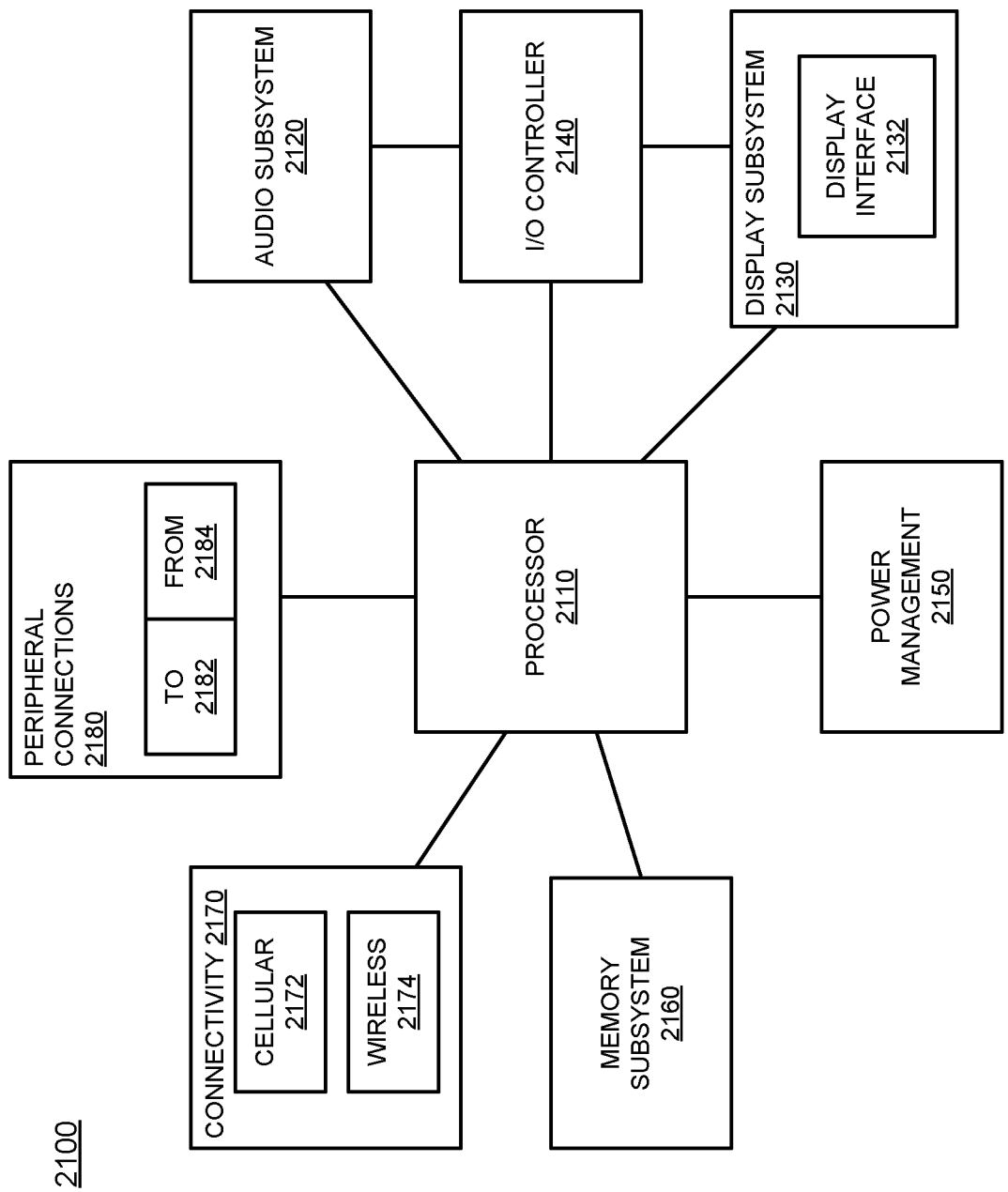
FIG. 4 illustrates a computer system, computing device or a SoC (System-on-Chip), where one or more components of the computing system is formed using a semiconductor package comprising two or more stacked dies, with at least one of the stacked dies having interconnect layers formed on two opposing surfaces, in accordance with some embodiments.

FIG. 4 illustrates a computer system, computing device or a SoC (System-on-Chip) 2100, where one or more components of the computing system 2100 is formed using a semiconductor package comprising two or more stacked dies, with at least one of the stacked dies having interconnect layers formed on two opposing surfaces, in accordance with some embodiments. It is pointed out that those elements of FIG. 4 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, one or more components of the computing system 2100 may be formed using a semiconductor package comprising two or more stacked dies, with at least one of the stacked dies having interconnect layers formed on two opposing surfaces, e.g., as discussed with respect to FIGS. 1-3B. Merely as an example, a first component (e.g., a memory of the memory subsystem 2160) of the computing device 2100 may be included one of the dies 102 or 105 of FIGS. 1-3B, and a second component (e.g., a processor 2110) of the computing device 2100 may be included another of the dies 102 or 105 of FIGS. 1-3B.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Example 1. An apparatus comprising: a first die having a first surface and a second surface, the first die comprising: a first layer formed on the first surface of the first die, wherein the first layer includes one or more first interconnects, and a second layer formed on the second surface of the first die, wherein the second layer includes one or more second interconnects; a second die coupled to the first layer; and a plurality of structures to couple the apparatus to an external component, wherein the plurality of structures is coupled to the second layer.

Example 2. The apparatus of example 1 or any other example, wherein the first die lacks a Through-Silicon-Via (TSV) connecting the first layer on the first surface and the second layer on the second surface.

Example 3. The apparatus of example 1 or any other example, wherein the first die comprises: a first plurality of active components coupled to the first layer; and a second plurality of active components coupled to the second layer.

Example 4. The apparatus of any of examples 1-3 or any other example, wherein the plurality of structures is a first plurality of structures, and wherein the apparatus further comprises: a second plurality of structures coupled to the second die, wherein the second die is coupled to the first layer through the second plurality of structures.

Example 5. The apparatus of example 4 or any other example, further comprising: a third layer coupled to first layer, wherein the third layer comprises one or more redistribution structures, wherein the second die is coupled to the first layer through the third layer.

Example 6. The apparatus of example 4 or any other example, wherein the second die is coupled to the first layer, without any intervening layer comprising redistribution structures between the second die and the first layer.

Example 7. The apparatus of any of examples 1-3 or any other example, further comprising: a third layer coupled to second layer, wherein the third layer comprises one or more redistribution structures, wherein the plurality of structures is coupled to the second layer via the third layer.

Example 8. The apparatus of any of examples 1-3 or any other example, further comprising: a third die disposed between the first die and the second die, wherein the second die is coupled to the first layer via the third die.

Example 9. The apparatus of example 8 or any other example, wherein the third die comprises: a third layer formed on a first surface of the third die; and a fourth layer formed on a second surface of the third die, wherein the third die lacks a Through-Silicon-Via (TSV) connecting the third layer and the fourth layer.

Example 10. A semiconductor package comprising: a first die, a second die, and a third die arranged in a stacked arrangement, wherein the second die comprises: a first interconnect layer that is formed on a first surface of the second die and that is coupled to the first die, and a second interconnect layer that is formed on a second surface of the second die and that is coupled to the third die, and wherein the second die lacks any through silicon via (TSV) to connect the first interconnect layer and the second interconnect layer.

Example 11. The semiconductor package of example 10 or any other example, wherein the first surface of the second die and the second surface of the second die are two opposing surfaces of the second die.

Example 12. The semiconductor package of example 10 or any other example, wherein the first die comprises: a third interconnect layer that is formed on a first surface of the first die and that is coupled to package interconnect structures to couple the semiconductor package to an external component; and a fourth interconnect layer that is formed on a second surface of the first die and that is coupled to the first interconnect layer of the second die, wherein the first die lacks any through silicon via (TSV) to connect the third interconnect layer and the fourth interconnect layer.

Example 13. The semiconductor package of any of examples 10-12 or any other example, wherein the second die comprises: a first plurality of active components coupled to the first interconnect layer; and a second plurality of active components coupled to the second interconnect layer.

Example 14. The semiconductor package of any of examples 10-12 or any other example, further comprising: molding compound to encapsulate the first die, the second die, and the third die.

Example 15. A method comprising: placing a first die on a substrate, the first die comprising: a first layer including one or more active devices, a second layer on a first side of the first layer, wherein the second layer includes one or more first interconnects, a third layer on a second side of the first layer, wherein the third layer includes one or more second interconnects, and a fourth layer comprising a bulk material, wherein the second layer is between the first layer and the fourth layer; and selectively removing the fourth layer to expose the second layer, such that two opposing surfaces of the first die comprises the second layer and the third layer, respectively.

Example 16. The method of example 15 or any other example, further comprising: forming a fifth layer on the substrate, wherein the fifth later comprises redistribution structures, and wherein the first die is placed on the substrate such that the third layer is disposed on the fifth layer.

Example 17. The method of example 15 or any other example, wherein selectively removing the fourth layer comprises: depositing a molding compound to encapsulate the first die; and selectively removing at least a part of the molding compound, along with the fourth layer, to expose the second layer through the molding compound.

Example 18. The method of example 15 or any other example, wherein selectively removing the fourth layer comprises: selectively removing the fourth layer via one or more of an etching, grinding, or polishing operation.

Example 19. The method of example 15 or any other example, further comprising: forming a fifth layer on the second layer, the fifth layer comprising redistribution structure; and placing a second die on the fifth layer.

Example 20. The method of any of examples 15-18 or any other example, further comprising: placing a second die on the second layer, without any intervening layer comprising redistributing structures between the second die and the first die.

Example 21. The method of any of examples 15-18 or any other example, further comprising: removing the substrate to expose the third layer; and depositing a plurality of interconnect structures on the third layer.

Example 22. The method of example 21 or any other example, wherein: the plurality of interconnect structures is to couple the first die to an external component.

Example 23. The method of any of examples 15-18 or any other example, wherein placing the first die on the substrate comprises: placing the third layer of the first die on the substrate.

Example 24. The method of any of examples 15-18 or any other example, wherein selectively removing the fourth layer comprises: selectively removing the fourth layer, while the first die is placed on the substrate.

Example 25. The method of any of examples 15-18 or any other example, further comprising: refraining from forming any via for connecting the second layer and the third layer.

Example 26. An apparatus comprising: means for performing the method of any of the examples 15-25 or any other example.

Example 27. An apparatus comprising: means for placing a first die on a substrate, the first die comprising: a first layer including one or more active devices, a second layer on a first side of the first layer, wherein the second layer includes one or more first interconnects, a third layer on a second side of the first layer, wherein the third layer includes one or more second interconnects, and a fourth layer comprising a bulk material, wherein the second layer is between the first layer and the fourth layer; and means for selectively removing the fourth layer to expose the second layer, such that two opposing surfaces of the first die comprises the second layer and the third layer, respectively.

Example 28. The apparatus of example 27 or any other example, further comprising: means for forming a fifth layer on the substrate, wherein the fifth later comprises redistribution structures, and wherein the first die is placed on the substrate such that the third layer is disposed on the fifth layer.

Example 29. The apparatus of example 27 or any other example, wherein the means for selectively removing the fourth layer comprises: means for depositing a molding compound to encapsulate the first die; and means for selectively removing at least a part of the molding compound, along with the fourth layer, to expose the second layer through the molding compound.

Example 30. The apparatus of example 27 or any other example, wherein the means for selectively removing the fourth layer comprises: means for selectively removing the fourth layer via one or more of an etching, grinding, or polishing operation.

Example 31. The apparatus of example 27 or any other example, further comprising: means for forming a fifth layer on the second layer, the fifth layer comprising redistribution structure; and means for placing a second die on the fifth layer.

Example 31. The apparatus of any of examples 27-30 or any other example, further comprising: means for placing a second die on the second layer, without any intervening layer comprising redistributing structures between the second die and the first die.

Example 32. The apparatus of any of examples 27-30 or any other example, further comprising: means for removing the substrate to expose the third layer; and means for depositing a plurality of interconnect structures on the third layer.

Example 33. The apparatus of example 32 or any other example, wherein: the plurality of interconnect structures is to couple the first die to an external component.

Example 34. The apparatus of any of examples 27-30 or any other example, wherein the means for placing the first die on the substrate comprises: means for placing the third layer of the first die on the substrate.

Example 35. The apparatus of any of examples 27-30 or any other example, wherein the means for selectively removing the fourth layer comprises: means for selectively removing the fourth layer, while the first die is placed on the substrate.

Example 36. The apparatus of any of examples 27-30 or any other example, further comprising: means for refraining from forming any via for connecting the second layer and the third layer.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first die having a first surface and a second surface, the first die comprising a first layer on the first surface, the first layer comprising one or more first interconnects, and a second layer on the second surface, the second layer comprising one or more second interconnects, wherein the first die comprises a first plurality of active components coupled to the first layer and a second plurality of active components coupled to the second layer;
   a second die coupled to the first layer;
   a plurality of first structures coupled to the second die, wherein the second die is coupled to the first layer through the plurality of first structures;
   a plurality of second structures to couple the apparatus to an external component, wherein the second structures are coupled to the second layer; and
   a third die coupled to the second die.

2. The apparatus of claim 1, further comprising a plurality of third structures coupled to the third die, wherein the second die is coupled to the third die through the plurality of third structures.

3. The apparatus of claim 1, wherein the plurality of first structures comprise at least one of bumps, bump pads, metal pillars, or balls.

4. The apparatus of claim 1, wherein the plurality of second structures comprise at least one of bumps, bump pads, metal pillars, or balls.

5. An apparatus comprising:
   a first die having a first surface and a second surface, the first die comprising a first layer on the first surface, the first layer comprising one or more first interconnects, and a second layer on the second surface, the second layer comprising one or more second interconnects, wherein the first die comprises a first plurality of active components coupled to the first layer and a second plurality of active components coupled to the second layer;
   a second die coupled to the first layer; a third layer coupled to the second layer, wherein the third layer comprises one or more redistribution structures;
   a plurality of structures to couple the apparatus to an external component, wherein the structures are coupled to the second layer via the third layer; and
   a third die coupled to the second die.

6. The apparatus of claim 5, further comprising a plurality of third structures coupled to the third die, wherein the second die is coupled to the third die through the plurality of third structures.

7. The apparatus of claim 5, wherein the plurality of structures comprise at least one of bumps, bump pads, metal pillars, or balls.

8. The apparatus of claim 5, wherein the plurality of structures is a first plurality of structures, and wherein the apparatus further comprises a second plurality of structures coupled to the second die, wherein the second die is coupled to the first layer through the second plurality of structures.

9. The apparatus of claim 5, wherein the second die is coupled to the first layer, without any intervening layer comprising redistribution structures between the second die and the first layer.

10. An apparatus comprising:
    a first die having a first surface and a second surface, the first die comprising a first layer on the first surface, the first layer comprising one or more first interconnects, and a second layer on the second surface, the second layer comprising one or more second interconnects, wherein the first die comprises a first plurality of active components coupled to the first layer and a second plurality of active components coupled to the second layer;
    a second die coupled to the first layer; a third die between the first die and the second die, wherein the second die is coupled to the first layer via the third die;
    a plurality of structures to couple the apparatus to an external component, wherein the structures are coupled to the second layer; and
    a plurality of third structures coupled to a third die, wherein the second die is coupled to the third die through the plurality of third structures.

11. The apparatus of claim 10, wherein the plurality of structures comprise at least one of bumps, bump pads, metal pillars, or balls.

12. The apparatus of claim 10, further comprising a plurality of second structures coupled to the second die, wherein the third die is coupled to the second die through the plurality of third structures.

13. The apparatus of claim 10, wherein the plurality of second structures comprise at least one of bumps, bump pads, metal pillars, or balls.

14. The apparatus of claim 10, further comprising a third layer coupled to the second layer, wherein the third layer comprises one or more redistribution structures coupled to the plurality of structures.

\* \* \* \* \*